US012731965B2

(12) United States Patent
Kim et al.

(10) Patent No.: US 12,731,965 B2
(45) Date of Patent: Sep. 8, 2026

(54) SUBSTRATE PROCESSING EQUIPMENT AND METHOD OF DRIVING SUBSTRATE PROCESSING EQUIPMENT

(71) Applicant: SEMES CO., LTD., Cheonan-si (KR)

(72) Inventors: Jae Min Kim, Gunpo-si (KR); Gun Min Lee, Hongseong (KR)

(73) Assignee: Semes Co., Ltd., Chungcheongnam-do (KR)

( * ) Notice: Subject to any disclaimer, the term of this patent is extended or adjusted under 35 U.S.C. 154(b) by 261 days.

(21) Appl. No.: 18/581,653

(22) Filed: Feb. 20, 2024

(65) Prior Publication Data

US 2024/0421566 A1 Dec. 19, 2024

(30) Foreign Application Priority Data

Jun. 15, 2023 (KR) ........................ 10-2023-0076662

(51) Int. Cl.
*H02B 1/056* (2006.01)
*H02B 1/20* (2006.01)
*H10P 72/00* (2026.01)
*H10P 72/76* (2026.01)

(52) U.S. Cl.
CPC ............... *H02B 1/056* (2013.01); *H02B 1/20* (2013.01); *H10P 72/0462* (2026.01); *H10P 72/7618* (2026.01)

(58) Field of Classification Search
CPC ............................ H02B 1/056; H01L 21/6719
See application file for complete search history.

(56) References Cited

U.S. PATENT DOCUMENTS 5,784,238 A * 7/1998 Nering ...................... H02J 1/10 361/65
2011/0148213 A1* 6/2011 Baldwin ................ H02J 1/001 307/82
2012/0078545 A1* 3/2012 Hong .................. G01R 21/133 702/60

FOREIGN PATENT DOCUMENTS

KR 10-2013-0089013 A 8/2013

* cited by examiner

*Primary Examiner* — Scott Bauer
(74) *Attorney, Agent, or Firm* — Harness, Dickey & Pierce, P.L.C.

(57) ABSTRACT

A substrate processing equipment and a method of driving the substrate processing equipment, which automatically cut off power supplied to a main circuit breaker and a branch circuit breaker when an operator inspects a process chamber or a power supply system. The substrate processing equipment for processing a substrate includes: a process processing module including loads utilized in a process for processing a substrate; a branch circuit breaker installed on a periphery to the process processing module and electrically connected to the loads; a main circuit breaker electrically connected to the branch circuit breaker and supplying power to the branch circuit breaker; and a power distribution board in which the branch circuit breaker is mounted, and including a power distribution board door, in which the main circuit breaker cuts off power when the power distribution board door is opened.

16 Claims, 6 Drawing Sheets

FIG. 2

SUBSTRATE PROCESSING EQUIPMENT AND METHOD OF DRIVING SUBSTRATE PROCESSING EQUIPMENT

CROSS-REFERENCE TO RELATED APPLICATIONS

This application claims priority to and the benefit of Korean Patent Application No. 10-2023-0076662 filed in the Korean Intellectual Property Office on Jun. 15, 2023 the entire contents of which are incorporated herein by reference.

TECHNICAL FIELD

The present invention relates to a substrate processing equipment and a method of driving the substrate processing equipment, and to a substrate processing equipment for processing a substrate and a method for driving the substrate processing equipment.

BACKGROUND ART

In semiconductor manufacturing, substrate processing facilities are deployed for various processes, such as cleaning, etching, deposition, exposure, development, heat treatment, and liquid treatment.

These substrate processing facilities are driven by supplying power to loads, such as motors, pumps, heaters, chillers, and plasma generators, of the driving unit in the process of transferring, heating, etching, cooling, and liquid-treating substrates. Power is blocked or supplied to the loads by branch circuit breakers installed in each of the process chambers.

In this case, the branch circuit breakers receive power from a main circuit breaker, which is electrically connected to a main power line, and distribute the received power to the respective loads.

On the other hand, the branch circuit breakers may be switched off by the operator when the operator is inspecting the process chamber or checking the power supply system, and in this case, even though the branch circuit breaker is switched to the closed state, the branch circuit breaker is electrically connected to the main circuit breaker, so that an input terminal maintains a live wire state.

Therefore, when an operator wants to inspect a process chamber or check the power supply system, even though he/she switches the branch circuit breaker to the closed state and proceeds with the task, the electrical connection to the main circuit breaker remains live, thereby putting the operator at risk of electric shock.

In particular, due to confusion or lack of familiarity with the task, an operator may proceed with the task while blocking a circuit breaker that is not related to the task among several branch circuit breakers. This puts the operator in a dangerous situation that may lead to electric shock accident.

Further, when another work switches on the main circuit breaker to activate while the operator switches off the main circuit breaker and is proceeding with the work in the state where the power is inactive state, there is also an accidental hazard of electric shock accident.

SUMMARY OF THE INVENTION

The present invention to solve the foregoing problems provides a substrate processing equipment and a method of driving the substrate processing equipment, which automatically cut off power supplied to a main circuit breaker and a branch circuit breaker when an operator inspects a process chamber or a power supply system.

The present invention to solve the foregoing problems also provides a substrate processing equipment and a method of driving the substrate processing equipment, which prevent power supplied to a main circuit breaker and a branch circuit breaker from switching to an active state when an operator inspects a process chamber or a power supply system.

The object of the present invention is not limited thereto, and other objects not mentioned will be clearly understood by those of ordinary skill in the art from the following description.

An exemplary embodiment of the present invention provides a substrate processing equipment for processing a substrate includes: a process processing module including loads utilized in a process for processing a substrate; a branch circuit breaker installed on a periphery to the process processing module and electrically connected to the loads; a main circuit breaker electrically connected to the branch circuit breaker and supplying power to the branch circuit breaker; and a power distribution board in which the branch circuit breaker is mounted, and including a power distribution board door, in which the main circuit breaker cuts off power when the power distribution board door is opened.

According to the exemplary embodiment, the substrate processing equipment may further include: a door open/close detection unit mounted on a periphery of the power distribution board door, switching to a first contact when the power distribution board door is opened and switching to a second contact when the power distribution board door is closed; and a shunt unit electrically connected to the door open/close detection unit and not cutting off the main circuit breaker to allow the main circuit breaker to be switched to a turn-off state when the door open/close detection unit is in the first contact and to allow the main circuit breaker to be switched to a turn-on state when the door open/close detection unit is in the second contact.

According to the exemplary embodiment, the door open/close detection unit may be formed of at least one of a magnetic sensor, a relay switch, and an object detection sensor.

According to the exemplary embodiment, the door open/close detection unit may have one end of an internal contact that is electrically connected with an input terminal of the branch circuit breaker, and the other end of the internal contact that is electrically connected with the shunt unit, the first contact may be an energized state of electrical connection between the input terminal of the branch circuit breaker and the shunt unit, and the second contact may be in a de-energized state of electrical connection between the input terminal of the branch circuit breaker and the shunt unit.

According to the exemplary embodiment, the main circuit breaker may include an internal relay for energizing or de-energizing an internal contact, and the internal relay may be de-energized by the shunt unit.

According to the exemplary embodiment, the main circuit breaker may maintain a turn-off state until the door open/close detection unit is switched to the second contact when the main circuit breaker is switched to the turn-off state by the shunt unit.

According to the exemplary embodiment, the shunt unit may include a relay or a switching element.

According to the exemplary embodiment, the power distribution board door may be pivotably or slidably installed in an opening region of the power distribution board.

According to the exemplary embodiment, the process processing module may include a plurality of process chambers that are disposed while being adjacent to each other, the branch circuit breaker may include a plurality of branch circuit breakers, and the plurality of branch circuit breakers may be electrically connected with the plurality of process chambers, respectively, to supply or cut off power to each of the plurality of process chambers.

According to the exemplary embodiment, the process processing module may further include a buffer unit and a transfer chamber disposed adjacent to each other, and each of the plurality of branch circuit breakers may be electrically connected with the buffer unit and the transfer chamber to supply or cut off power to each of the buffer unit and the transfer chamber.

According to the exemplary embodiment, the power distribution board may be disposed while being adjacent to the process processing module, and the main circuit breaker may be disposed while being spaced apart from the process processing module.

According to the exemplary embodiment, the power distribution board may be disposed within a fab together with the process processing module, and the main circuit breaker may be disposed within a sub-fab.

According to the exemplary embodiment, the sub-fab and the fab may be disposed on different layers.

According to the exemplary embodiment, the main circuit breaker may be formed of an Earth Leakage Circuit Breaker (ELB) or a Molded Case Circuit Breaker (MCCB), and the branch circuit breaker may be formed of an ELB or an MCCB.

According to the exemplary embodiment, the main circuit breaker may not be disposed in the power distribution board.

Another exemplary embodiment of the present invention provides a method of driving a substrate processing equipment processing a substrate, the method including: a power supply operation in which a door open/close detection unit detects a closed state of a power distribution board door and switches to a second contact, and the second contact causes a shunt unit not to turn off the main circuit breaker so as to supply power from the main circuit breaker to a branch circuit breaker; a process processing operation in which each of the process processing modules receives power from the branch circuit breaker to process a substrate; and a power cut-off operation in which the door open/close detection unit detects an open state of the power distribution board door and switches to a first contact, and the shunt unit turns off the main circuit breaker to cut off power supplied from the main circuit breaker to the branch circuit breaker.

According to the exemplary embodiment, the method may further include a power activation operation in which the door open/close detection unit detects the closed state of the power distribution board door and switches to the second contact, and the shunt unit does not cut off the main circuit breaker.

According to the exemplary embodiment, the main circuit breaker may not be disposed in the power distribution board.

According to the exemplary embodiment, the door open/close detection unit may have one end of an internal contact that is electrically connected with an input terminal of the branch circuit breaker, and the other end of the internal contact that is electrically connected with the shunt unit, the first contact may be an energized state of electrical connection between the input terminal of the branch circuit breaker and the shunt unit, and the second contact may be in a de-energized state of electrical connection between the input terminal of the branch circuit breaker and the shunt unit.

Still another exemplary embodiment of the present invention provides a substrate processing equipment for processing a substrate, the substrate processing equipment including: a process processing module which is installed within a fab and includes a process chamber, a buffer unit, and a transfer chamber having loads utilized in a process of processing a substrate; a branch circuit breaker which is installed within the fab, is formed of an Earth Leakage Circuit Breaker (ELB) or a Molded Case Circuit Breaker (MCCB), is installed on a periphery of the process processing module, and includes a plurality of branch circuit breakers, each of the plurality of the branch circuit breakers being electrically connected to each of the loads in the process chamber, the buffer unit, and the transfer chambers; a main circuit breaker which is installed in a sub-fab formed on a different layer from the fab, is formed of ELB or an MCCB, includes an internal relay for energizing or de-energizing an internal contact, is electrically connected to the branch circuit breaker, and supplies power to the branch circuit breaker; a power distribution board which is installed within the fab, installed on a periphery of the process processing module, including the branch circuit breaker mounted, and including a pivotable or slidable power distribution board door; a door open/close detection unit which is installed within the fab, is formed of at least one of a magnetic sensor, a relay switch, and an object detection sensor, is installed on a periphery of the power distribution board door, and switching to a first contact when the power distribution board door is opened and switching to a second contact when the power distribution board door is closed; and a shunt unit which is installed within the sub-fab, includes a relay or a switching element, is electrically connected to the door open/close detection unit, and does not cut off the main circuit breaker to allow the main circuit breaker to be switched to a turn-off state when the door open/close detection unit is in the first contact and to allow the main circuit breaker to be switched to a turn-on state when the door open/close detection unit is in the second contact, in which the door open/close detection unit has one end of an internal contact that is electrically connected with an input terminal of the branch circuit breaker, and the other end of the internal contact that is electrically connected with the shunt unit, the first contact is an energized state of an electrical connection between the input terminal of the branch circuit breaker and the shunt unit, and the second contact is in a de-energized state of electrical connection between the input terminal of the branch circuit breaker and the shunt unit.

According to the present invention, it is possible to automatically cut off power supplied to a main circuit breaker and a branch circuit breaker when an operator inspects a process chamber or a power supply system.

According to the present invention, it is possible to prevent power supplied to a main circuit breaker and a branch circuit breaker from switching to an active state when an operator inspects a process chamber or a power supply system.

The effect of the present invention is not limited to the foregoing effects, and non-mentioned effects will be clearly understood by those skilled in the art from the present specification and the accompanying drawings.

BRIEF DESCRIPTION OF THE DRAWINGS

FIG. 2 is a top plan view schematically illustrating the interior of the substrate processing equipment illustrated in FIG. 1.

DETAILED DESCRIPTION

Figure 1:
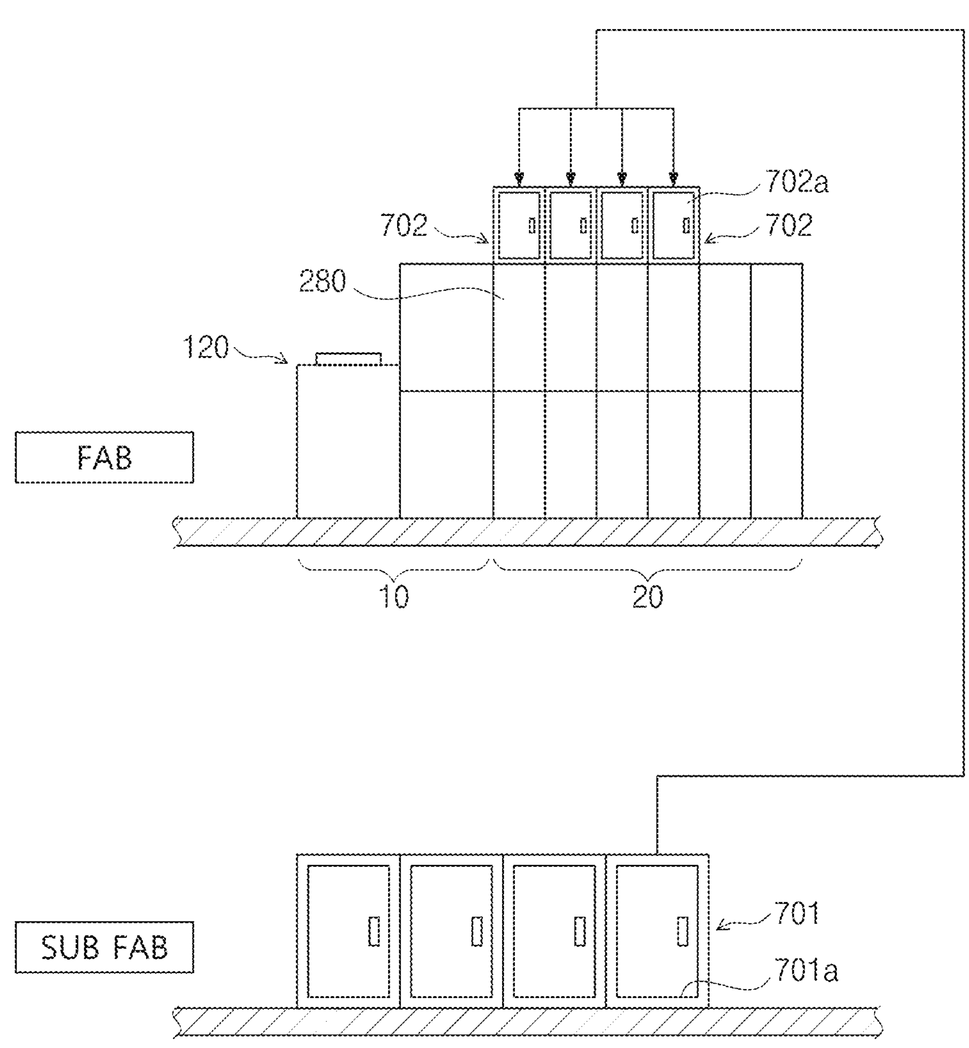
FIG. 1 is a front view schematically illustrating a substrate processing equipment according to an exemplary embodiment of the present invention.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
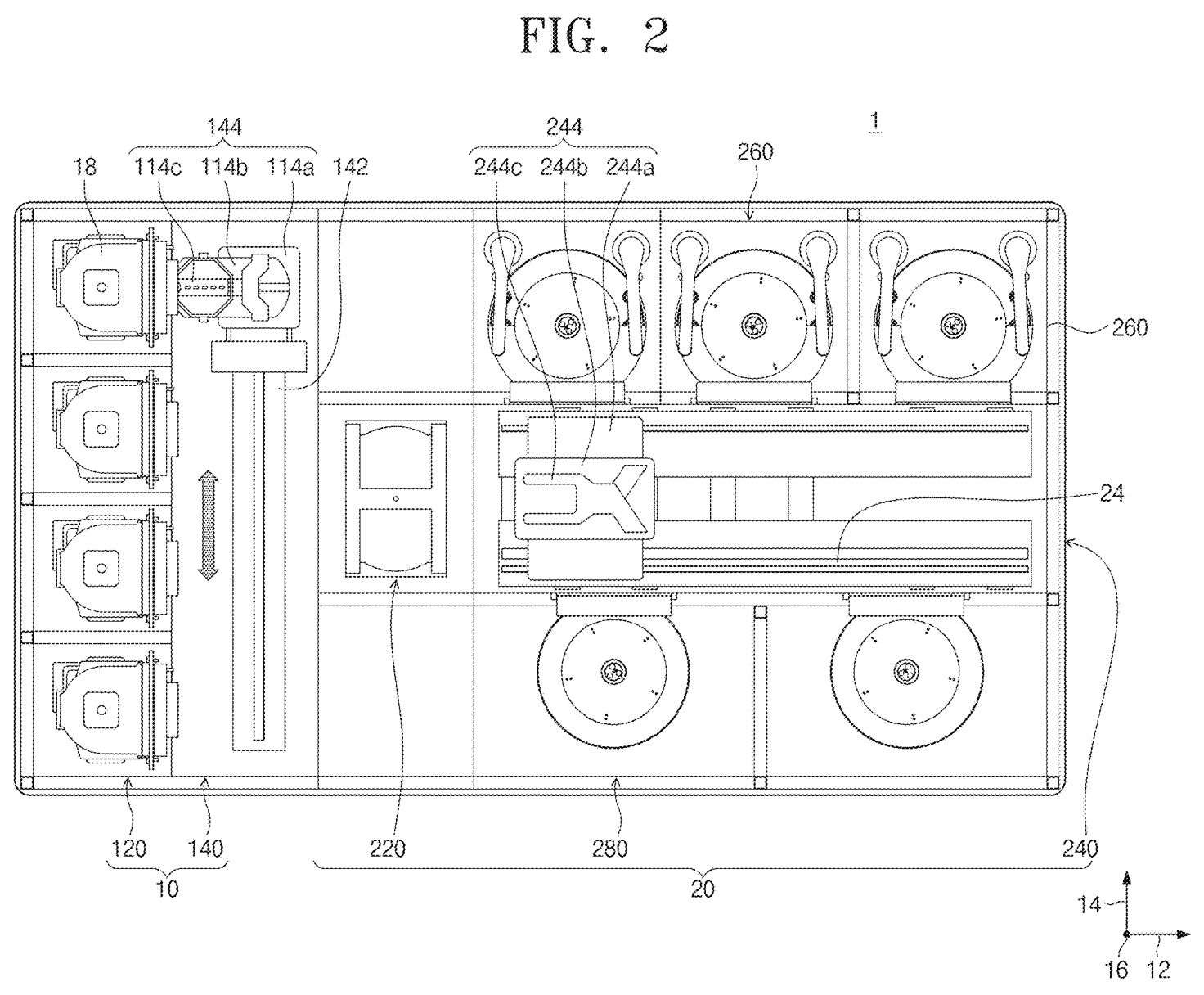
Figure 3:
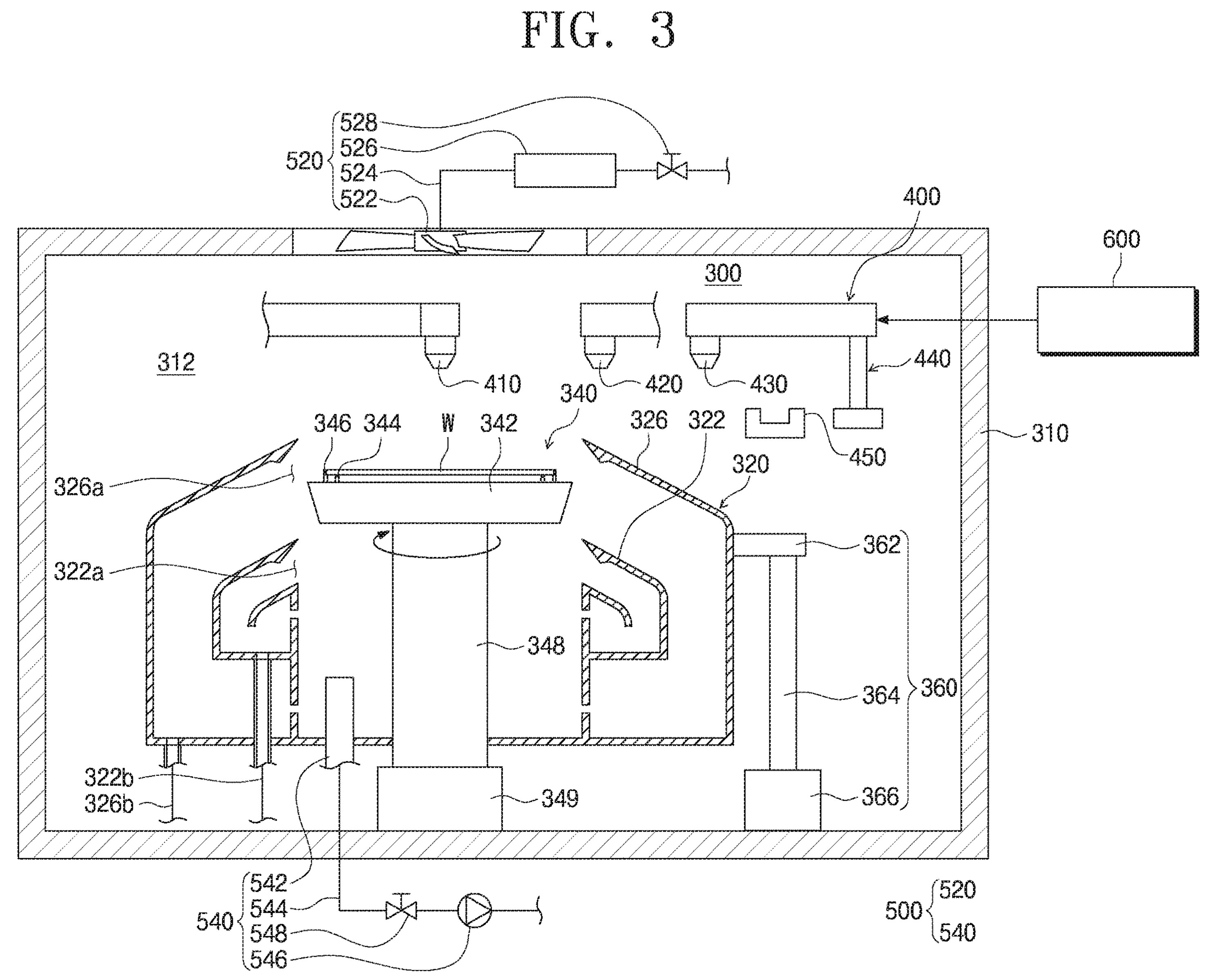
FIG. 3 is a longitudinal cross-sectional view schematically illustrating the substrate processing equipment illustrated in FIG. 2.
Figure 4:
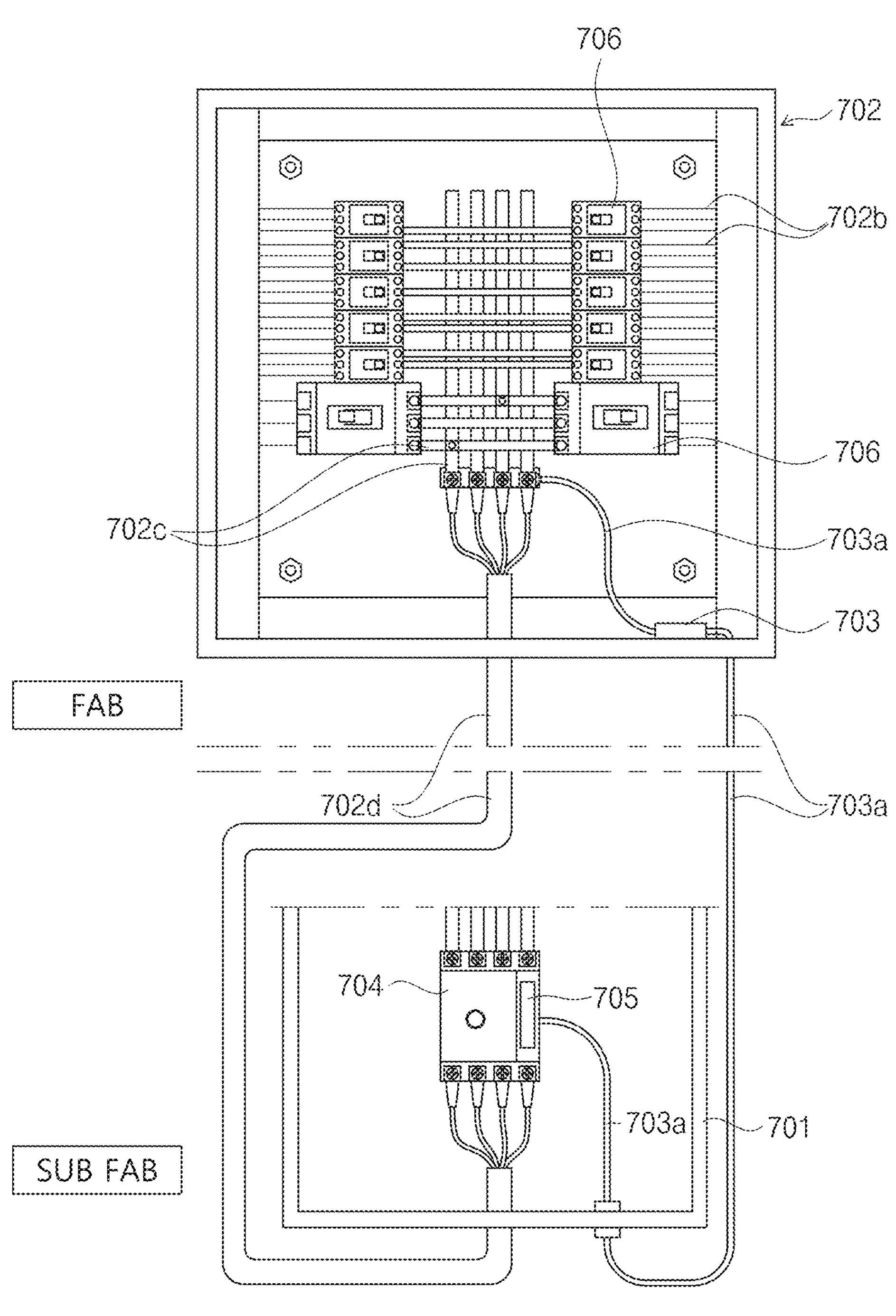
FIG. 4 is a front view schematically illustrating the electrical connection in a state where doors of a power distribution board and a switchboard illustrated in FIG. 1 are open.
Figure 5:
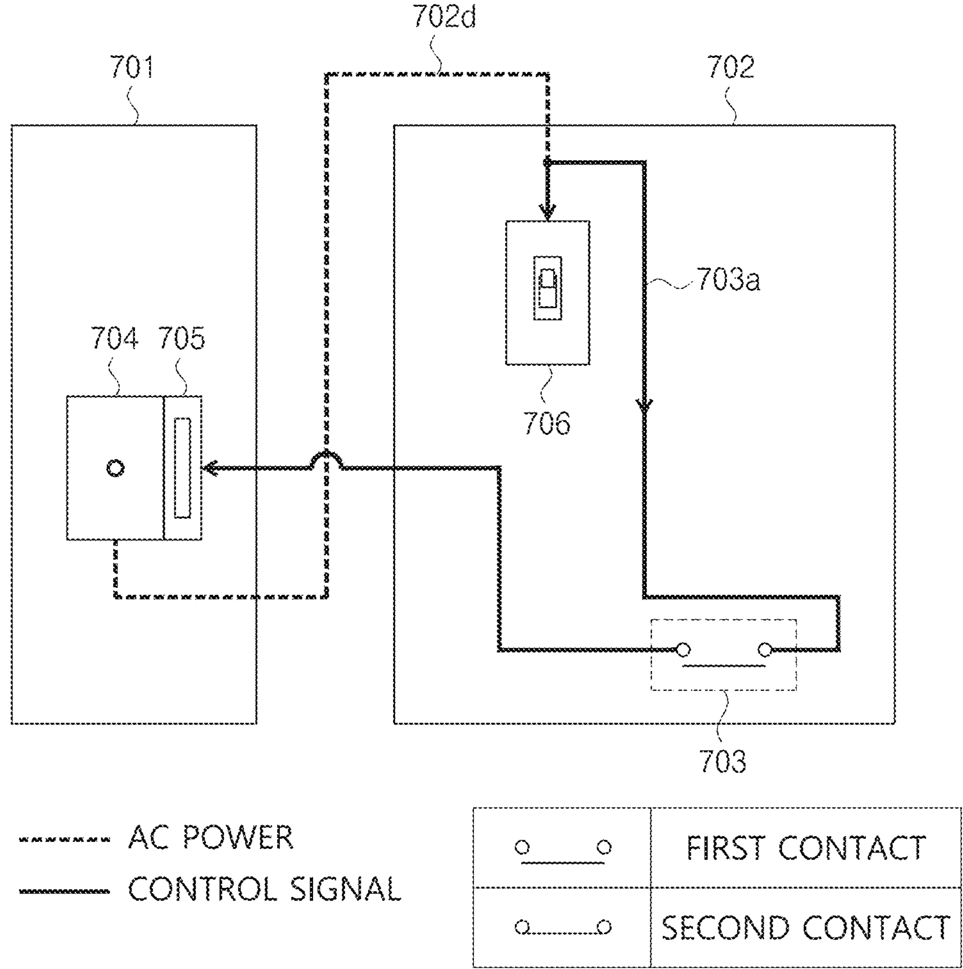
FIG. 5 is an electrical wiring diagram schematically illustrating the electrical connection of a main circuit breaker and a branch circuit breaker illustrated in FIG. 4.

FIG. 1 is a front view schematically illustrating a substrate processing equipment according to an exemplary embodiment of the present invention. FIG. 2 is a top plan view schematically illustrating the interior of the substrate processing equipment illustrated in FIG. 1. FIG. 3 is a longitudinal cross-sectional view schematically illustrating the substrate processing equipment illustrated in FIG. 2. FIG. 4 is a front view schematically illustrating the electrical connection in a state where doors of a power distribution board and a switchboard illustrated in FIG. 1 are open. FIG. 5 is an electrical wiring diagram schematically illustrating the electrical connection of a main circuit breaker and a branch circuit breaker illustrated in FIG. 4.

Referring to FIGS. 1 to 5, a substrate processing equipment 1 includes an index module 10 and a process processing module 20, and the index module 10 includes a load port 120 and a transfer frame 140. The load port 120, the transfer frame 140, and the process processing module 20 are arranged in sequential rows. Hereinafter, a direction in which the load port 120, the transfer frame 140, and the process processing module 20 are arranged is referred to as a first direction 12, a direction perpendicular to the first direction 12 when viewed from above is referred to as a second direction 14, and a direction perpendicular to a plane including the first direction 12 and the second direction 14 is referred to as a third direction 16.

A carrier 18 in which a substrate W is accommodated is seated on the load port 120. A plurality of load ports 120 is provided and is arranged in a line along the second direction 14. In FIG. 1, it is illustrated that four load ports 120 are provided. However, the number of load ports 120 may be increased or decreased depending on conditions, such as process efficiency and footprint of the process processing module 20. Slots (not illustrated) provided to support an edge of the substrate are formed in the carrier 18. A plurality of slots is provided in the third direction 16, and the substrates are positioned within the carrier so as to be stacked while being spaced apart from each other in the third direction 16. As the carrier 18, a Front Opening Unified Pod (FOUP) may be used.

The process processing module 20 may include a buffer unit 20, a transfer chamber 240, and process chambers 260 and 280. The transfer chamber 240 is disposed so that a longitudinal direction thereof is parallel to the first direction 12. The process chambers 260 and 280 are disposed on opposite sides of the transfer chamber 240 in the second direction 14. The process chambers 260 may be provided to be symmetrical to each other relative to the transfer chamber 240. Some of the process chambers 260 and 280 are disposed along the longitudinal direction of the transfer chamber 240. Additionally, some of the process chambers 260 and 280 are arranged to be stacked on top of each other. That is, the process chambers 240 may be disposed in an array of A×B (A and B are natural numbers equal to or greater than 1) on opposite sides of the transfer chamber 240. Here, A is the number of process chambers 260 and 280 provided in a line along the first direction 12, and B is the number of process chambers 260 and 280 provided in a line along the third direction 16. When four or six process chambers 260 are provided on each of the opposite sides of the transfer chamber 240, the process chambers 260 and 280 may be disposed in an array of 2×2 or 3×2. The number of process chambers 260 and 280 may be increased or decreased. Unlike the foregoing, the process chamber 260 may be provided only to one side of the transfer chamber 240. In addition, the process chambers 260 and 280 may be provided as a single layer on one side and the opposite sides of the transfer chamber 240. In addition, the process chambers 260 and 280 may be provided in various arrangements unlike the above. In addition, the loads of the units for transferring or processing the substrate are electrically connected to the branch circuit breakers 706, respectively, so that each of the buffer unit 220, the transfer chamber 240, and the process chambers 260 and 280 is supplied with power.

The process chambers 260 and 280 of the present exemplary embodiment may be categorized as including a cleaning chamber and a drying chamber. In this case, the cleaning chamber may be a substrate processing equipment for cleaning the substrate, which will be described below, and the drying chamber may be a substrate processing equipment for drying the substrate.

The buffer unit 220 is disposed between the transfer frame 140 and the transfer chamber 240. The buffer unit 220 may provide a space in which the substrate W stays before the substrate W is transferred between the transfer chamber 240 and the transfer frame 140. The buffer unit 220 is provided with slots (not illustrated) on which the substrate W is placed therein, and the slots (not illustrated) are provided in plurality so as to be spaced apart from each other in the third direction 16. In the buffer unit 220, a side facing the transfer frame 140 and a side facing the transfer chamber 240 are each open.

The transfer frame 140 transfers the substrate W between the carriers 18 seated at the load port 120 and the buffer unit 220. The transfer frame 140 is provided with an index rail 142 and an index robot 144. The index rail 142 is provided so that a longitudinal direction thereof is parallel to the second direction 14. The index robot 144 is installed on the index rail 142, and linearly moves in the second direction 14 along the index rail 142. The index robot 144 includes a base **144*a*, a body 144*b*, and an index arm 144*c*. The base 144*a* is installed to be movable along the index rail 142. The body 144*b* is coupled to the base 144*a*. The body 144*b* is provided to be movable in the third direction 16 on the base 144*a*. Further, the body 144*b* is provided to be rotatable on the base 144*a*. The index arm 144*c* is coupled to the body 144*b* and is provided to be movable forwardly and backwardly with respect to the body 144*b*. A plurality of index arms 144*c* is provided to be individually driven. The index arms 144*c* are disposed to be stacked in the state of being spaced apart from each other in the third direction 16. Some of the index arms 144*c* may be used when the substrate W is transferred from the process processing module 20 to the carrier 18, and another some of the plurality of index arms 144*c* may be used when the substrate W is transferred from the carrier 130 to the process processing module 20. This may prevent the particles generated from the substrate W before the process processing from being attached to the substrate W after the process processing in the process in which the index robot 144** loads and unloads the substrate W.

The transfer chamber 240 transfers the substrate W between the buffer unit 220 and the process chambers 260. A guide rail 242 and a main robot 244 are provided to the transfer chamber 240. The guide rail 242 is disposed so that a longitudinal direction thereof is parallel to the first direction 12. The main robot 244 is installed on the guide rail 242 and linearly moved along the first direction 12 on the guide rail 242. The main robot 244 includes a base **244*a*, a body 244*b*, and a main arm 244*c*. The base 244*a* is installed to be movable along the guide rail 242. The body 244*b* is coupled to the base 244*a*. The body 244*b* is provided to be movable in the third direction 16 on the base 244*a*. Further, the body 244*b* is provided to be rotatable on the base 244*a*. The main arm 244*c* is coupled to the body 244*b*, and provided to be movable forwardly and backwardly with respect to the body 244*b***.

Further, the process chamber 260 is provided with the substrate processing apparatus 300. In the present exemplary embodiment, the case where the substrate processing apparatus 300 performs a liquid treatment process on the substrate will be described as an example. The liquid treatment process may further include a process of cleaning the substrate.

In one example, the substrate processing apparatus 300 further includes a chamber 310, a processing container 320, a spin head 340, a lifting unit 360, a liquid discharge unit 400, an airflow forming unit 500, a liquid supply unit 600, and a controller. The chamber 310 provides a processing space 312 in which a process for processing the substrate W is performed.

The processing container 320 is positioned in the processing space 312 and is provided in the shape of a cup with an open top. When viewed from above, the processing container 320 is positioned to overlap an exhaust pipe. The processing container 320 includes an internal collection container 322 and an external collection container 326. Each of the collection containers 322 and 326 collects a different treatment liquid from the treatment liquids used in the process. The internal collection container 322 is provided in the shape of an annular ring surrounding the spin head 340, and the external collection container 326 is provided in the shape of an annular ring surrounding the internal collection container 322. An inner space **322*a* of the internal collection container 322 and a space 326*a* between the external collection container 326 and the internal collection container 322 function as inlets for the treatment liquid to flow into the internal collection container 322 and the external collection container 326, respectively. Collection lines 322*b* and 326*b* are connected to the bottom surfaces of the collection containers 322 and 326, respectively, to extend vertically in the down direction. Each of the collection lines 322*b* and 326*b* functions as a discharge pipe to discharge the treatment liquid that has been introduced through the respective collection containers 322 and 326**. The discharged treatment liquid may be reused through an external treatment liquid regeneration system (not illustrated).

The spin head 340 is provided as a support unit for supporting and rotating the substrate W. The spin head 340 is disposed within the processing container 320. The spin head 340 supports the substrate W and rotates the substrate W during the process. The spin head 340 includes a chuck body 342, a support pin 344, a chuck pin 346, and a support shaft 348. The chuck body 342 has a top surface that is provided in a substantially circular shape when viewed from above. The support shaft 348 rotatable by a motor 349 is fixedly coupled to the bottom surface of the chuck body 342. A plurality of support pins 344 is provided. The support pins 344 are disposed to be spaced apart at predetermined intervals on the edge of the upper surface of the chuck body 342 and protrude upwardly from the chuck body 342. The support pins 334 are arranged in combination with each other to have an overall annular ring shape. The support pin 344 supports an edge of the rear surface of the substrate W so that the substrate W is spaced apart from the upper surface of the spin chuck 342 at a predetermined distance. A plurality of chuck pins 346 is provided. The chuck pin 346 is disposed to be farther from the center of the chuck body 342 than the support pin 344. The chuck pin 346 is provided to protrude upwardly from the chuck body 342. The chuck pin 346 supports a side portion of the substrate W such that the substrate W does not move laterally from a regular position when the spin head 340 is rotated. The chuck pin 346 is provided to move linearly between the standby position and the support position along the radial direction of the chuck body 342. The standby position is a position farther from the center of the chuck body 342 relative to the support position. When the substrate W is loaded to or unloaded from the spin head 340, the chuck pin 346 is positioned in the standby position, and when the process is performed on the substrate W, the chuck pin 346 is positioned in the support position. In the support position, the chuck pin 346 is in contact with the side portion of the substrate W. In this case, the spin head 340 may be electrically connected to the branch circuit breaker 706 to receive power.

The lifting unit 360 adjusts the relative height between the processing container 320 and the spin head 340. The lifting unit 360 linearly moves the processing container 320 in the vertical direction. As the processing container 320 moves in the vertical direction, the relative height of the processing container 320 with respect to the spin head 340 changes. The lifting unit 460 includes a bracket 360, a moving shaft 362, and a driver 364. The bracket 362 is fixedly installed on the outer wall of the processing container 320, and a moving shaft 364, which is moved in the vertical direction by a driver 366, is fixedly coupled to the bracket 364. The processing container 320 is lowered so that the spin head 340 protrudes over the top of the processing container 320 when the substrate W is placed on or lifted from the spin head 340. In addition, when the process is in progress, the height of the processing container 320 is adjusted so that the treatment liquid is introduced into the predetermined collection container 326 according to the type of the treatment liquid supplied to the substrate W. In this case, the lifting unit 360 may be electrically connected to the branch circuit breaker 706 to receive power.

Unlike the description above, the lifting unit 360 may move the spin head 340 in the vertical direction instead of the processing container 320.

The liquid discharge unit 400 supplies various types of liquids to the substrate W. The liquid discharge unit 400 further includes a plurality of nozzles 410 to 430. Each nozzle is moved to a process position and a standby position by a nozzle position driver 440. A process position is defined herein as a position where the nozzles 410 to 430 are capable of discharging liquid onto the substrate W positioned within the processing container 320, and a standby position is defined as a position where the nozzles 410 to 430 are waiting outside of the process position. According to an example, the process position may be a position at which the nozzles 410 to 430 may supply a liquid to the center of the substrate W. For example, when viewed from above, the nozzles 410 to 430 may be moved linearly or axially to be moved between the process position and the standby position. The treatment liquid discharged from the liquid discharge unit 400 onto the substrate W may be a liquefied treatment liquid. Additionally, in the standby position, a collection pipe 450 may be disposed below the third nozzle 430. The collection pipe 450 collects the treatment liquid when the third nozzle 430 discharges the treatment liquid for cleaning. Additionally, the liquid discharge unit 400 may expose the liquid by a pump. Additionally, the liquid discharge unit 400 may receive power by the driver 440 and the pump being electrically connected to the branch circuit breaker 706.

The plurality of nozzles 410 to 430 discharges different types of liquid. The treatment fluid discharged from the nozzles 410 to 430 may include at least one of a chemical, a rinse solution, and a drying fluid. Referring to the exemplary embodiment of FIG. 2, a first nozzle 410 may be a nozzle for discharging chemicals. A second nozzle 420 may be a nozzle that discharges a rinse solution. A third nozzle 430 may be a nozzle that discharges a drying fluid. For example, the chemical may be a liquid capable of etching a film formed on the substrate W or removing particles remaining on the substrate W. The chemical may be a liquid having a property of strong acid or strong base. The chemical may include sulfuric acid, hydrofluoric acid, or ammonia. The rinse liquid may be a liquid capable of rinsing the chemicals remaining on the substrate W. For example, the rinse solution may be pure water. The drying fluid may be provided as a liquid capable of replacing the residual rinse liquid on the substrate W. The drying fluid may be a liquid having lower surface tension than the rinse liquid. The drying fluid may be an organic solvent. The drying fluid may be isopropyl alcohol (IPA). The third nozzle 430 may be connected to the liquid supply unit 600 to be described later.

The airflow forming unit 500 forms a downward airflow in the processing space 312. The airflow forming unit 500 supplies airflow from an upper portion of the chamber 310 and exhausts airflow from a lower portion of the chamber 310. The airflow forming unit 500 further includes an airflow supply unit 520 and an exhaust unit 540. The airflow supply unit 520 and the exhaust unit 540 are positioned facing each other in the vertical direction.

The airflow supply unit 520 supplies gas in the downward direction. The gas supplied from the airflow supply unit 520 may be air from which impurities are removed. The airflow supply unit 520 further includes a fan 522, an airflow supply line 524, a supply valve 528, and a filter 526. The fan 522 is installed on the ceiling surface of the chamber 310. When viewed from above, the fan 522 is positioned to face the processing container. The fan 522 may be positioned to provide air toward the substrate W positioned within the processing container. The airflow supply line 524 is connected to the fan 522 to supply air to the fan 522. A supply valve 528 is installed in the airflow supply line 524 to regulate the amount of airflow supplied. The filter 526 is installed in the airflow supply line 524 to filter the air. For example, the filter 526 may remove particles and moisture contained in the air.

The exhaust unit 540 exhausts the processing space 312. The exhaust unit 540 further includes an exhaust pipe 542, a pressure reducing member 546, and an exhaust valve 548. The exhaust pipe 542 is installed on the bottom surface of the chamber 310 and is provided as a pipe to exhaust the processing space 312. The exhaust pipe 542 is positioned such that the exhaust port faces upwardly. The exhaust pipe 542 is positioned such that the exhaust port is in communication with the interior of the processing container. That is, the top of the exhaust pipe 542 is located within the processing container. Accordingly, the downward airflow formed within the processing container is exhausted through the exhaust pipe 542.

The pressure reducing member 546 reduces pressure of the exhaust pipe 542. A negative pressure is formed in the exhaust pipe 542 by the pressure reducing member 546, which exhausts the processing container. The exhaust valve 548 is installed in the exhaust pipe 542 and opens and closes the exhaust port of the exhaust pipe 542. The exhaust valve 548 regulates the exhaust volume.

The liquid supply unit 600 supplies the treatment liquid to at least one of the plurality of nozzles 410 to 430. The liquid supply unit 600 may heat the treatment liquid. Additionally, the liquid supply unit 600 may store the treatment liquid.

The controller may include a centralized computing unit. Further, the controller controls the spin head 340, the lifting unit 360, the liquid discharge unit 400, the airflow forming unit 500, and the liquid supply unit 600 according to an algorithm set internally to process the substrate W according to the recipe. The controller also receives power from the branch circuit breaker 706 to operate.

In the present exemplary embodiment, the case where the substrate processing apparatus 300 is applied to the liquid treatment process has been described as an example, but the substrate processing apparatus 300 may also be applied to facilities for a cleaning process, an etching process, a deposition process, a development process, a heat treatment process, and the like.

The substrate processing apparatus 300 may further comprise a switchboard 701, a power distribution board 702, a door open/close detection portion 703, a main circuit breaker 704, a shunt unit 705, and a branch circuit breaker 706.

The switchboard 701 is schematically formed in a case shape. The switchboard 701 may be spaced apart from the process processing module 20. Further, the switchboard 701 may be disposed on a different layer other than the layer on which the process processing module 20 is located. For example, the process processing module 20 may be installed within a fab, and the switchboard 701 may be installed in a sub-fab that is a lower layer of the fab. Further, the switchboard 701 may have an opening region in which a front of the case is opened, in which case the switchboard 701 may further include a switchboard door 701*a* installed in the opening region. The switchboard door 701*a* may be rotated or slidable in the switchboard 701 to open or close the opening region of the switchboard 701. While the exemplary switchboard 701 is configured to protrude from the top of the process processing module 20, it is of course understood that the switchboard 701 may be implemented in various variations, such as a flat type horizontal to the top surface of the process processing module 20. The switchboard 701 may have the main circuit breaker 704 installed therein. Here, since the switchboard 701 corresponds to the path of supplying power that may be consumed by the entire process processing module 20, the switchboard 701 may be configured in a location that is as far away as possible from a working path of the operator due to the risk of electrical shock accident.

The power distribution board 702 is schematically formed in a case shape. The power distribution board 702 may be disposed above or aside the process processing module 20. Additionally, the power distribution board 702 may be formed in plural. In this case, the plurality of power distribution boards 702 may provide power to the process chambers 260 and 280, respectively. The power distribution board 702 has an opening region in a portion of the case, and may further include a power distribution board door 702*a* formed in the opening region. The power distribution board door 702*a* may be rotated or slidable in the opening region of the power distribution board 702 to open and close the opening region of the power distribution board 702. Additionally, the power distribution board door 702*a* may open and close the opening region of the power distribution board 702 by being disengaged and separated from the power distribution board 702. Further, the branch circuit breaker 706 is mounted on the power distribution board 702. Also, on the inner side of the power distribution board 702, load wires 702B electrically connected with the loads, respectively, may be electrically connected with an output terminal of the branch circuit breaker 706. In addition, a busbar 702*c* electrically connected with an input terminal of each of the branch circuit breakers 706 is installed on the power distribution board 702. The busbar 702C is electrically connected to the main circuit breaker 704 by a supply wire 702*d*, and when power is supplied from the main circuit breaker 704, the power is distributed and supplied to each of the branch circuit breakers 706. In this case, the main circuit breaker 704 is not disposed in the power distribution board 702, but is disposed in the sub fab, so that a main administrator manages a control authority to supply and block the entire power system. Thus, a worker inspecting the power distribution board 702 is prevented from inadvertently blocking power of other facilities that are not being inspected.

The door open/close detection unit 703 is installed on the inner side of the power distribution board 702 that is in contact with the power distribution board door 702*a* of the power distribution board 702. The door open/close detection unit 703 is electrically connected with the busbar 702*c*, which is the input terminal of the branch circuit breaker 706 by the signal connection line 703*a*, and the other end of the internal contact is electrically connected with the shunt unit 705 by the signal connection line 703*a*. In this case, the door open/close detection unit 703 forms a second contact when the power distribution board door 702*a* is closed and switches to a first contact when the power distribution board door 702*a* is opened. Here, the first contact corresponds to an electrical connection between the input terminal of the branch circuit breaker 706 and the shunt unit 705 in a short-circuit state, and the second contact corresponds to an electrical connection between the input terminal of the branch circuit breaker 706 and the shunt unit 705 in an energized state. Such the door open/close detection unit 703 may be formed of a magnetic sensor that is installed in the power distribution board door 702*a* and the opening region to switch to the second contact when magnetic force is detected and switch to the first contact when no magnetic force is detected, depending on whether magnetic force is detected. The door open/close detection unit 703 may also be formed of a relay switch that switches to the first contact when in contact with the power distribution board door 702*a* and switches to the second contact when not in contact with the power distribution board door 702*a*. However, the present invention does not limit the door open/close detection unit 703 to magnetic sensors and relay switches, and may of course be in any form, such as a push switch or an object detection sensor, that directly contacts the power distribution board door 702*a* or that detects an object and switch from the first contact to the second contact.

The main circuit breaker 704 may be disposed within the distribution board 701. The main circuit breaker 704 may be formed of with an Earth Leakage Circuit Breaker (ELB) or a Molded Case Circuit Breaker (MCCB). Further, the main circuit breaker 704 may be a three-phase or two-phase breaker. Further, the main circuit breaker 704 is electrically connected to the main power wire. The main power wire is electrically connected to the main circuit breaker 704 installed in each of the distribution boards 701 to provide power at all times. Further, the main circuit breaker 704 is electrically connected to each of the branch circuit breakers 706 by the supply wire 702*d*. Here, where the main circuit breaker 704 is installed in the sub-fab and the branch circuit breakers 706 are installed in the fab, the supply wire 702*d* may be deployed with extensions across the sub-fab and the fab. Here, the main circuit breaker 704 is placed in a space, such as the sub fab, that is not easily accessible to workers while being protected by the switchboard 701. Thus, since the operator cannot manipulate the main circuit breaker 704, the operator may ensure that the substrate processing process is cut off by the manipulation of the operator and the risk of an electric shock accident is reduced. Furthermore, the main circuit breaker 704 supplies power to the branch circuit breaker 706 in the turn-on state when the internal contact is energized, and cuts off the power supplied to the branch circuit breaker 706 in the turn-off state when the internal contact is de-energized. Further, the main circuit breaker 704 is provided with an internal relay that causes the contact to be energized or closed, and the internal relay may switch the state of the contact to an energized or de-energized state depending on the state of the shunt unit 705, which is described below.

The shunt unit 705 controls the state of the internal contact of the main circuit breaker 704 to an energized or de-energized state, depending on the open or closed state of the power distribution board door 702*a*. The shunt unit 705 may be configured to include a relay or switching element. The shunt unit 705 is electrically connected to the door open/close detection unit 703. In this case, the shunt unit 705 turns off the main circuit breaker 704 when the door open/close detection unit 703 is in the first contact state, thereby switching the power supply state of the main circuit breaker 704 to a cut-off state. The main circuit breaker 704 then switches the internal contact to a short circuit state, thereby cutting off the power flowing to the branch circuit breaker 706. In contrast, the shunt unit 705 releases the function of blocking the main circuit breaker 704 so that the main circuit breaker 704 may be switched to the turn-on state at any time when the door open/close detection unit 703 is in the second contact state.

The branch circuit breaker 706, of which the input terminal is electrically connected to the branch points of the busbar 702C, receives power from the main circuit breaker 704. Further, the branch circuit breaker 706 may be formed of an Earth Leakage Circuit Breaker (ELB) or a Molded Case Circuit Breaker (MCCB). Further, the branch circuit breaker 706 may be a three-phase or two-phase breaker. Further, the branch circuit breaker 706 is electrically connected to each of the configured loads within the substrate processing apparatus 300 by a branch power supply line. The configured loads within the substrate processing apparatus 300 may include power consuming components, such as motors or pumps, installed in each of the process chambers 260 and 280. The branch circuit breaker 706 supplies power to the load side when the internal contact is energized, and cuts off power to the load side when the internal contact is de-energized. Additionally, the branch circuit breaker 706 may allow an operator to manipulate a lever to switch the internal contact to an energized or de-energized state.

Hereinafter, a method of driving the substrate processing equipment according to the present invention as described above will be described.

Figure 6:
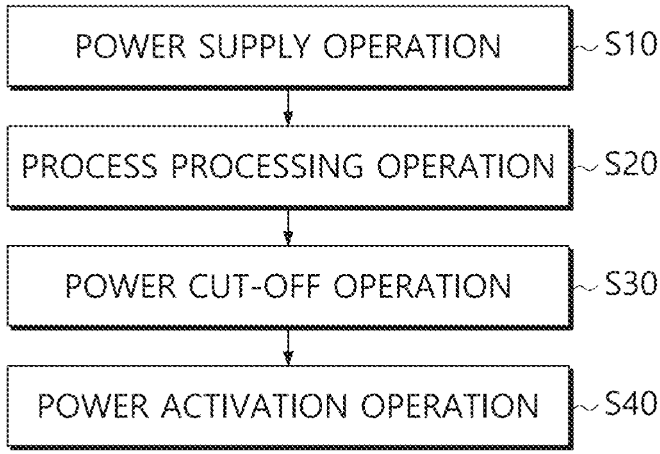
FIG. 6 is a flowchart of a method of operating a substrate processing equipment according to the present invention.

FIG. 6 is a flowchart of a method of operating a substrate processing equipment according to the present invention.

Referring further to FIG. 6, a method of driving a substrate processing equipment according to the present invention includes a power supply operation S10, a process processing operation S20, a power cut-off operation S30, and a power activation operation S40.

First, in the power supply operation S10, the door open/close detection unit 703 detects the closed state of the power distribution board door 702*a* and switches to the second contact. The shunt unit 705 then becomes inactive and does not cut off the main circuit breaker 704, and the main circuit breaker 704 supplies power to the branch circuit breaker 706.

Next, in the process processing operation S20, each of the process processing modules receives power from the branch circuit breaker 706 to process the substrate W. More specifically, in the process processing operation S20, the index robot 144 loads the substrates W received at the load port 120 to the buffer unit 220, and loads the substrates W received at the buffer unit 220 to the respective process chambers 260 and 280 by the main robot 244 in the transfer chamber 240 and processes the substrate W. In this case, each of the loads, the index robot 144 and the main robot 244, is electrically connected to each of the branch circuit breakers 706 to receive power. Next, in the process processing operation S20, a chemical is discharged from the first nozzle 410 onto the substrate W that has been loaded to the process chambers 260 and 280 to remove metal foreign matters, organic matters, particles, or the like remaining on the substrate W, pure water DIW is discharged onto the substrate W through the second nozzle 420 to remove chemicals remaining on the substrate W, and a drying fluid is supplied to the substrate W through the third nozzle 430 to replace the rinse liquid remaining on the substrate W with the drying fluid. In this case, the loaded drivers 366 and 440, the liquid discharge unit 400, and the lifting unit 360 receive power from the branch circuit breaker 706.

Next, the power cut-off operation S30 occurs when an operator opens the power distribution board door 702*a* to inspect the substrate processing apparatus 300. Accordingly, in the power-off operation S30, the door open/close detection unit 703 detects the open state of the power distribution board door 702*a* and switches to the first contact to drive the shunt unit 705. The driven shunt unit 705 then switches the main circuit breaker 704 to a turn-off state, thereby cutting off power supplied from the main circuit breaker 704 to the branch circuit breaker 706. Thus, electricity is not supplied to the input and output terminals of the busbar 702*c* of the power distribution board 702 and the branch circuit breaker 706 and the electrical wiring to the load. In other words, the moment the operator opens the power distribution board door 702*a*, all power inside the power distribution board 702 is cut off. Thus, the worker is not subject to electric shock when working on the power distribution board 702 and all power systems below during the inspection. Furthermore, in the power-off operation S30, even when the main circuit breaker 704 is accidentally switched to the turn-on state by another worker, the shunt unit 705 maintains the main circuit breaker 704 in the turn-off state to prevent an electric shock accident.

Next, the power activation operation S40 proceeds when the operator has completed the inspection of the substrate processing apparatus 300. Accordingly, in the power activation operation S40, when the operator closes the power distribution board door 702*a*, the door opening detection unit 703 is switched to the second contact, the shunt unit 705 is switched to the inactive state, and the blocking state of the main circuit breaker 704 is released by the shunt unit 705. After finishing the inspection, the worker moves to the location where the distribution board 701 is located and switches a lever or an open/close switch of the main circuit breaker 704 installed on the distribution board 701 to the turn-on state, and the main circuit breaker 704 resupplies power to the branch circuit breaker 706.

Next, after the power activation operation S40, the aforementioned power supply operation S10 and process processing operation S20 are performed again to process the substrate W.

As described above, the present invention has been described with reference to the specific matters, such as a specific component, limited exemplary embodiments, and drawings, but these are provided only for helping general understanding of the present invention, and the present invention is not limited to the aforementioned exemplary embodiments, and those skilled in the art will appreciate that various changes and modifications are possible from the description.

Therefore, the spirit of the present invention should not be limited to the described exemplary embodiments, and it will be the that not only the claims to be described later, but also all modifications equivalent to the claims belong to the scope of the present invention.

What is claimed is:

1. A substrate processing equipment for processing a substrate, the substrate processing equipment comprising:

a process processing module including loads utilized in a process for processing the substrate;

a branch circuit breaker installed on a periphery of the process processing module and electrically connected to the loads;

a main circuit breaker electrically connected to the branch circuit breaker, the main circuit breaker configured to supply power to the branch circuit breaker; and a power distribution board in which the branch circuit breaker is mounted, the power distribution board including a power distribution board door, wherein the main circuit breaker is configured to cut off the power when the power distribution board door is opened, the power distribution board is adjacent to the process processing module, and the main circuit breaker is spaced apart from the process processing module.

2. The substrate processing equipment of claim 1, further comprising:

a door open/close detection unit mounted on a periphery of the power distribution board door, the door open/close detection unit configured to switch to a first contact state when the power distribution board door is opened and switch to a second contact state when the power distribution board door is closed; and a shunt unit electrically connected to the door open/close detection unit, the shunt unit configured to not cut off the main circuit breaker, and to allow the main circuit breaker to be switched to a turn-off state when the door open/close detection unit is in the first contact state and to allow the main circuit breaker to be switched to a turn-on state when the door open/close detection unit is in the second contact state.

3. The substrate processing equipment of claim 2, wherein the door open/close detection unit comprises at least one of a magnetic sensor, a relay switch, and an object detection sensor.

4. The substrate processing equipment of claim 2, wherein the door open/close detection unit has one end of an internal contact that is electrically connected with an input terminal of the branch circuit breaker, and another end of the internal contact that is electrically connected with the shunt unit, the first contact state is an energized state of electrical connection between the input terminal of the branch circuit breaker and the shunt unit, and the second contact state is in a de-energized state of electrical connection between the input terminal of the branch circuit breaker and the shunt unit.

5. The substrate processing equipment of claim 2, wherein the main circuit breaker includes an internal relay configured to energize or de-energize an internal contact of the main circuit breaker, and the internal relay is configured to be de-energized by the shunt unit.

6. The substrate processing equipment of claim 5, wherein the main circuit breaker is configured to maintain the turn-off state until the door open/close detection unit is switched to the second contact state, when the main circuit breaker is switched to the turn-off state by the shunt unit.

7. The substrate processing equipment of claim 2, wherein the shunt unit includes a relay or a switching element.

8. The substrate processing equipment of claim 1, wherein the power distribution board door is pivotably or slidably installed in an opening region of the power distribution board.

9. The substrate processing equipment of claim 1, wherein the process processing module includes a plurality of process chambers that are disposed adjacent to each other, the branch circuit breaker includes a plurality of branch circuit breakers, and the plurality of branch circuit breakers are electrically connected with the plurality of process chambers, respectively, and the plurality of branch circuit breakers are configured to supply or cut off the power to each of the plurality of process chambers.

10. The substrate processing equipment of claim 9, wherein the process processing module further includes a buffer unit and a transfer chamber disposed adjacent to each other, and each of the plurality of branch circuit breakers is electrically connected with the buffer unit and the transfer chamber, the plurality of branch circuit breakers being configured to supply or cut off the power to each of the buffer unit and the transfer chamber.

11. The substrate processing equipment of claim 1, wherein the power distribution board is disposed within a fab together with the process processing module, and the main circuit breaker is disposed within a sub-fab.

12. The substrate processing equipment of claim 11, wherein the sub-fab and the fab are disposed on different layers.

13. The substrate processing equipment of claim 1, wherein the main circuit breaker is an Earth Leakage Circuit Breaker (ELB) or a Molded Case Circuit Breaker (MCCB), and the branch circuit breaker is an ELB or an MCCB.

14. The substrate processing equipment of claim 1, wherein the main circuit breaker is not disposed in the power distribution board.

15. A substrate processing equipment for processing a substrate, the substrate processing equipment comprising:

a process processing module which is installed within a fab and includes a process chamber, a buffer unit, and a transfer chamber having loads utilized in a process of processing the substrate;

a branch circuit breaker which is installed within the fab, is an Earth Leakage Circuit Breaker (ELB) or a Molded Case Circuit Breaker (MCCB), is installed on a periphery of the process processing module, and includes a plurality of branch circuit breakers, the plurality of branch circuit breakers being electrically connected to each of the loads in the process chamber, the buffer unit, and the transfer chamber;

a main circuit breaker which is installed in a sub-fab on a different layer from the fab, is an ELB or an MCCB, includes an internal relay for energizing or de-energizing a first internal contact, is electrically connected to the branch circuit breaker, and supplies power to the branch circuit breaker;

a power distribution board which is installed within the fab, installed on the periphery of the process processing module, includes the branch circuit breaker mounted therein, and includes a power distribution board door that is pivotable or slidable;

a door open/close detection unit which is installed within the fab, is at least one of a magnetic sensor, a relay switch, and an object detection sensor, is installed on a periphery of the power distribution board door, and switches to a first contact state when the power distribution board door is opened and switches to a second contact state when the power distribution board door is closed; and a shunt unit which is installed within the sub-fab, includes a relay or a switching element, is electrically connected to the door open/close detection unit, and does not cut off the main circuit breaker to allow the main circuit breaker to be switched to a turn-off state when the door open/close detection unit is in the first contact state and to allow the main circuit breaker to be switched to a turn-on state when the door open/close detection unit is in the second contact state, wherein the door open/close detection unit has one end of a second internal contact that is electrically connected with an input terminal of the branch circuit breaker, and another end of the second internal contact that is electrically connected with the shunt unit, the first contact state is an energized state of an electrical connection between the input terminal of the branch circuit breaker and the shunt unit, and the second contact state is in a de-energized state of electrical connection between the input terminal of the branch circuit breaker and the shunt unit.

16. A substrate processing equipment for processing a substrate, the substrate processing equipment comprising:

a process processing module including loads utilized in a process for processing the substrate;

a branch circuit breaker installed on a periphery of the process processing module and electrically connected to the loads;

a main circuit breaker electrically connected to the branch circuit breaker, the main circuit breaker configured to supply power to the branch circuit breaker;

a power distribution board having the branch circuit breaker mounted therein, the power distribution board including a power distribution board door;

a door detector configured to detect opening and closing of the power distribution board door; and a shunt unit configured to switch the main circuit breaker to a turn-off state responsive to detection by the door detector that the power distribution board door is open, and to enable the main circuit breaker to be switched to a turn-on state responsive to the detection by the door detector that the power distribution board door is open, wherein the door detector has an internal contact including a first end electrically connected to an input terminal of the branch circuit breaker, and a second end electrically connected to the shunt unit.

* * * * *